(12) United States Patent
Schat

(10) Patent No.: US 10,868,551 B1
(45) Date of Patent: Dec. 15, 2020

(54) NON-INTRUSIVE FAULT DETECTION FOR PHASE-LOCKED LOOP

(71) Applicant: NXP B.V., Eindhoven (NL)

(72) Inventor: Jan-Peter Schat, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/882,248

(22) Filed: May 22, 2020

(51) Int. Cl.
*H03L 7/093* (2006.01)
*H03L 7/099* (2006.01)

(52) U.S. Cl.
CPC ............ *H03L 7/0992* (2013.01); *H03L 7/093* (2013.01)

(58) Field of Classification Search
CPC ....... H03L 7/085; H03L 7/093; H03L 7/0992; H03L 7/0994
USPC ................................ 327/147, 150, 156, 159
See application file for complete search history.

(56) References Cited

U.S. PATENT DOCUMENTS

| | | | |
|---|---|---|---|
| 6,557,117 B1 | 4/2003 | Wu et al. | |
| 7,328,383 B2 | 2/2008 | Chen et al. | |
| 9,806,880 B1 | 10/2017 | Wiklund et al. | |
| 10,396,974 B1 | 8/2019 | Schat et al. | |
| 2006/0049878 A1* | 3/2006 | Kawabe | H03L 7/1976 331/16 |
| 2008/0016422 A1* | 1/2008 | Ochi | G01R 31/31725 714/735 |
| 2014/0320186 A1* | 10/2014 | Jin | H03L 7/1075 327/159 |

OTHER PUBLICATIONS

Sanchez et al., "Practical Design Considerations for an All-Digital PLL in a Digital Car Radio Reception SoC," 2016 IEEE 36th Central American and Panama Convention (CONCAPAN XXXVI), pp. 1-5.

* cited by examiner

*Primary Examiner* — William Hernandez

(57) ABSTRACT

A mechanism is provided for detecting errors and parametric deviations in phase-locked loops (PLLs) by measuring the effectiveness of a PLL in recovering from an introduced delay in phase at a phase comparator of the PLL. Embodiments measure a proxy for the area under a phase difference recovery curve of the PLL. If the phase difference recovery is out of predefined thresholds for the PLL, then an error in the PLL is flagged or responded to. In some embodiments, the PLL is automatically re-trimmed to bring the PLL back within the predefined thresholds.

20 Claims, 6 Drawing Sheets

US 10,868,551 B1

NON-INTRUSIVE FAULT DETECTION FOR PHASE-LOCKED LOOP

BACKGROUND

Field

This disclosure relates generally to fault detection circuitry, and more specifically, to a circuit, external to a phase-locked loop (PLL), that can detect errors and parametric deviations in the PLL during normal operation.

Related Art

Phase-locked loop (PLL) circuits are used in a wide variety of high frequency applications, from clock clean-up circuits, to local oscillators for high performance radio communication links, and ultrafast switching frequency synthesizers in vector network analyzers. A PLL is a feedback system that combines a voltage-controlled oscillator and a phase comparator connected in a matter that the oscillator maintains a constant phase angle relative to a reference signal. In a typical configuration, a PLL compares the phase of the reference signal to the phase of an adjustable feedback signal. When the comparison is in a steady state, and the output frequency and phase are matched to the incoming frequency and phase of a phase detector, the PLL is said to be locked.

PLL parameters, like phase margin, influence overall performance of an integrated circuit. In many cases, a marginal failure (e.g., caused by weak, high ohmic effects or by aging) is worse than a complete failure, as a complete failure can be detected and counteracted. For safety-critical integrated circuits, PLL parameters should be measured not only once in production test, but also in the field and preferably concurrent to application mode.

It is therefore desirable to have a mechanism for efficiently detecting errors and parametric deviations in PLLs concurrently with application mode.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Embodiments provide a mechanism for detecting errors and parametric deviations in phase-locked loops (PLLs) by measuring the effectiveness of a PLL in recovering from an introduced delay in phase at a phase comparator of the PLL. Embodiments measure a proxy for the area under a phase difference recovery curve of the PLL. If the phase difference recovery is out of predefined thresholds for the PLL, then an error in the PLL is flagged or responded to. In some embodiments, the PLL is automatically re-trimmed to bring the PLL back within the predefined thresholds.

A phase-locked loop is a feedback system combining a voltage-controlled oscillator (VCO) and a phase comparator connected such that the oscillator maintains a constant phase angle relative to a reference signal. Phase-locked loops can be used, for example, to generate stable output high frequency signals from a fixed low-frequency signal. Such high frequency signals can be used for applications such as clock clean-up circuits, local oscillators for high performance radio communication links, and ultrafast switching frequency synthesizers in vector network analyzers. They are also found in safety-critical systems in, for example, automotive integrated circuits used in radar applications and communications between modules in an automobile.

Figure 1:
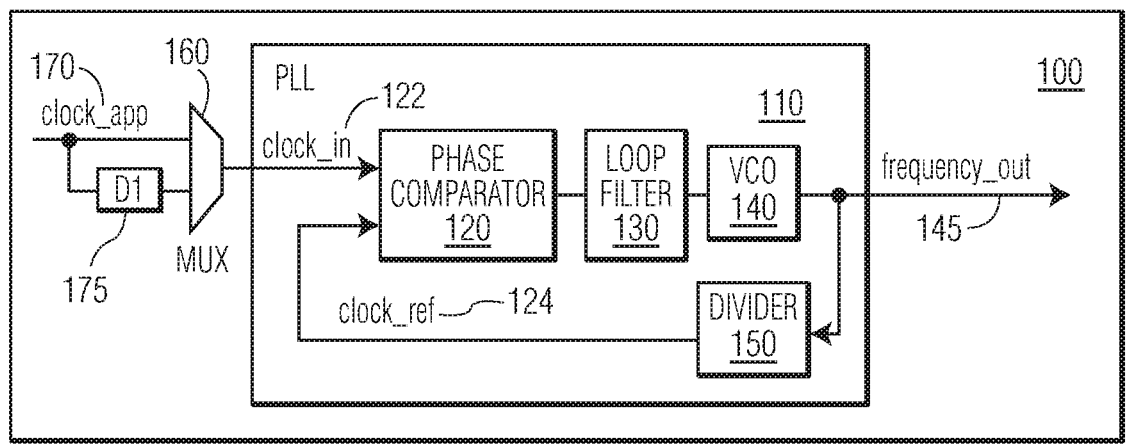
FIG. 1 is an example of a system incorporating a phased-lock loop circuit.

FIG. 1 is an example of a system 100 incorporating a phased-lock loop 110 circuit. Basic building blocks of a PLL are a phase comparator 120, a loop filter 130, a VCO 140, and a feedback divider 150. Negative feedback from VCO 140 through divider 150 to phase comparator 120 forces the phase comparator to produce an error signal proportional to the phase difference between clock_in 122 (a reference signal) and clock_ref 124 (the feedback signal). The error signal is then low pass filtered through loop filter 130 and used to control VCO 140, which creates an output frequency 145. If the output frequency drifts, then the phase error signal changes, driving the VCO frequency in the opposite direction to reduce the error. In this manner, the output phase is locked to the phase of the reference input, clock_in 122. A digital PLL uses a digital phase comparator 120. Divider 150 makes the output signal frequency of the PLL a rational multiple of clock_in 122.

In operation, VCO 140 generates a periodic output signal. If the phase of the oscillator falls behind that of clock_in 122, then phase detector 120 changes the control voltage of the VCO so that it speeds up. Similarly, if the phase moves ahead of clock_in, then the phase detector changes the control voltage to slow down the oscillator. In many cases, phase comparators can also respond to frequency differences to increase a lock-in range of allowable input frequencies. It should be noted that while the examples provided herein use a voltage controlled oscillator (VCO) as the referenced oscillator in the PLL, embodiments of the present invention are not restricted to PLLs having VCOs. In fact, current controlled oscillators (CCOs) and digitally controlled oscillators (DCOs) can be used in conjunction with embodiments.

As illustrated in FIG. 1, the PLL can be fed either by an application clock, clock_app 170, or a version of the application clock phase shifted by a delay D1 175. A multiplexer 160 can control which signal is provided to the phase comparator. Delay D1 is much smaller than the period of the application clock.

Figure 2:
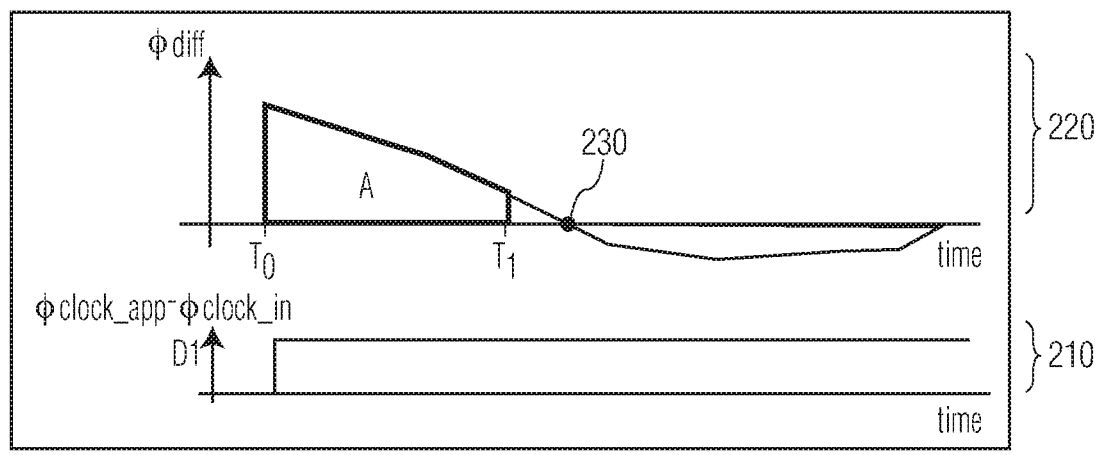
FIG. 2 is a chart illustrating a reaction of a PLL to introduction of a delay D1 charting phase difference, $\phi_{diff}$, at the phase comparator over time, where the PLL has a loop filter of a second order or higher.

FIG. 2 is a chart illustrating a reaction of a PLL to introduction of a delay D1 charting phase difference, $\phi_{diff}$, at the phase comparator of over time. Bottom chart 210 illustrates a phase step by switching clock_in from no delay to delay D1 at time $T_0$. Top chart 220 illustrates the reaction of the PLL, visible by a phase difference at the phase comparator ($\phi_{diff}(t)=\phi_{clock\_in}(t)-\phi_{clock\_ref}(t)$).

For a PLL having a loop filter of $2^{nd}$ or higher order, there is an integrating behavior of the loop filter with the VCO. Such behavior ensures that when settling from a disturbance like an input phase step, the phase difference $\phi_{diff}(t)$ converges to zero (as illustrated). In order to measure performance of the PLL in recovering from the phase step, an area A is defined under the $\phi_{diff}(t)$ curve from the time $T_0$ of applying step D1 to a chosen fixed time $T_1$ (typically, a few microseconds). $T_1$ is selected for the PLL as a time that should be before the zero crossing of $\phi_{diff}(t)$ (230). Area A is defined as:

$$A = \int_{T_0}^{T_1} \phi_{diff}(t)dt$$

The size of area A is an indicator of how long the PLL takes to recover from phase step D1. Therefore, area A is also a measure for phase margin. In general, if area A is too large for a specific PLL, then the PLL is reacting too slowly. Conversely, if area A is too small for that PLL, then the PLL is reacting too quickly. For a PLL reacting too quickly, the PLL may pass through jitter from input clock_app 170 and thereby lose ability to smooth the signal.

As mentioned above and illustrated in FIG. 2, time $T_1$ is chosen to occur prior to the zero crossing of $\phi_{diff}(t)$. As will be discussed more fully below, this is to get an accurate measure of how well the PLL recovers from the phase step. In addition, if $T_1$ is too small, then any small change in phase, such as jitter, will have a large impact on the measured area A, while if $T_1$ is larger, then jitter can average out over the time measure and result in a more reliable area A. In some embodiments, the performance of the PLL can be monitored to determine whether time $T_1$ is too large and thereby incorporates an undershoot where $\phi_{diff}(t)$ goes below zero. If so, then $T_1$ can be decreased to have $\phi_{diff}(t)$ stay in a range above zero. This can be done by having a circuitry supervise the counter described below.

Another method for arriving at an indicator for how long a PLL takes to recover from phase step D1, is to measure the phase margin. Measuring the phase margin can be done by measuring an initial height and an initial slope of $\phi_{diff}$. That is, measuring both $\phi_{diff}(T_0+dT)$ immediately after applying the phase step, and by measuring $d\phi_{diff}(T_0+dT)/dt$.

Measuring the size of area A to assess the health of the PLL has certain advantages over directly measuring the phase margin. The size of A is sensitive to the majority of defects in the loop filter, VCO, and phase comparator, including those defects that cannot be found by observing the PLL-lock bit. Defects that change the initial height immediately after phase step D1 or the slope immediately after the phase step of the $\phi_{diff}(t)$ curve will impact the size of A. In addition, the size of A is less sensitive to noise than the value of $\phi_{diff}(T_0+dT)$ immediately after the step, as used in directly measuring the phase margin. Finally, the size of A can be measured using a simple digital circuit, as detailed below, which does not require modification of the PLL. This also includes bang-bang all-digital PLLs that have a phase comparator with a binary output.

Figure 3:
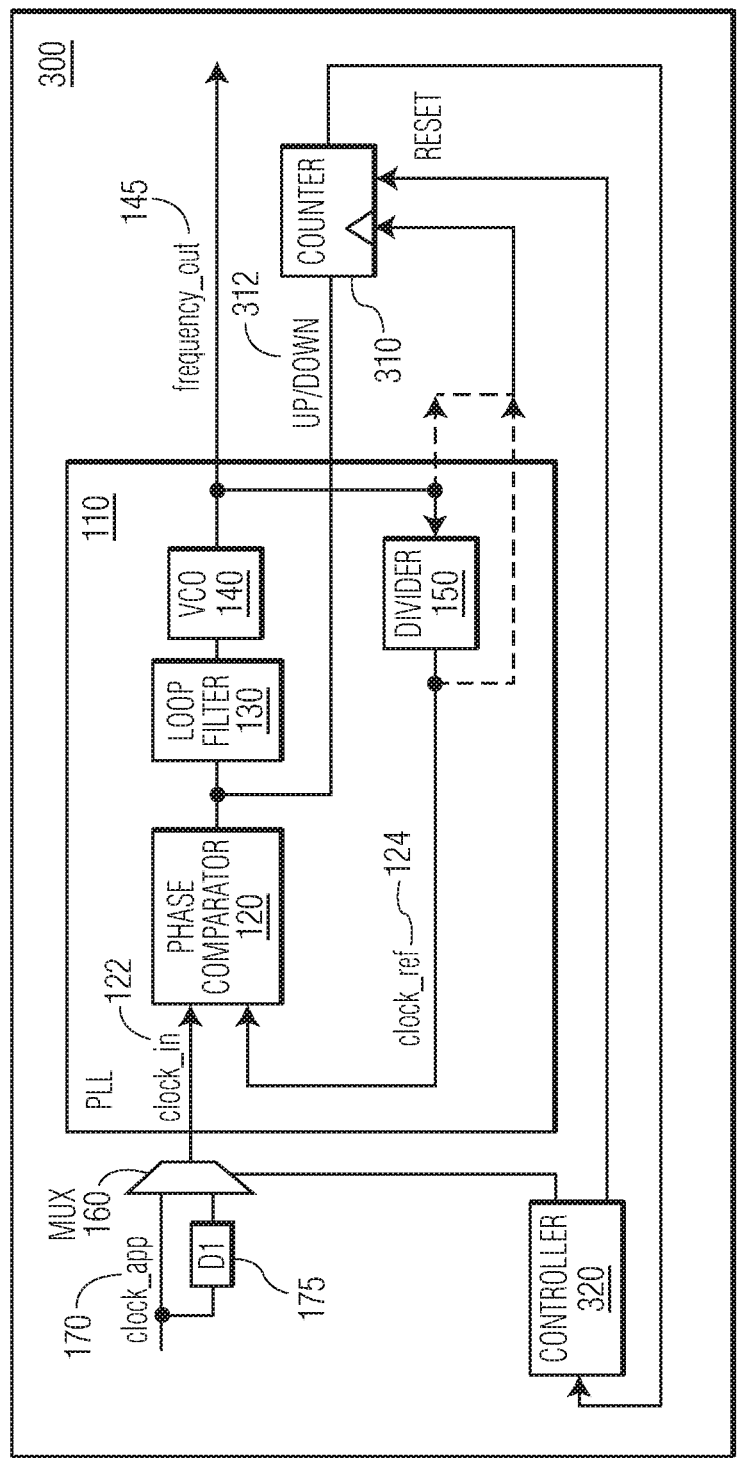
FIG. 3 is a simplified block diagram illustrating one example of a system having a circuit used in conjunction with a PLL to provide a measure of area A, usable in accord with embodiments of the present invention.

FIG. 3 is a simplified block diagram illustrating one example of a system 300 having a circuit used in conjunction with a PLL to provide a measure of area A, in accord with certain embodiments of the present invention. The circuit provided in FIG. 3 measures a proxy for the size of area A that can be compared to an upper and lower limit. The upper and lower limit are thresholds for error behavior exhibited by the PLL. One advantage of certain embodiments is that measuring area A can be done using the existing circuit elements of the PLL in conjunction with minimal external elements.

In FIG. 3, phase comparator 120 delivers a binary output signal. Counter 310 counts clock_ref 124 cycles or cycles from VCO 140 to measure area A in the following manner. If the output from phase comparator 120 is "1" (e.g., the phase comparator is trying to increase the VCO in order to reduce the phase difference), then the counter counts upwards. If the output from phase comparator 120 is "0," then the counter counts downwards. It should further be noted, however, that while the examples in this text use positive logic (i.e., in which a logic "0" means false and a logic "1" means true), embodiments are not limited to positive logic and embodiments can be used for negative logic circuits.

Figure 4:
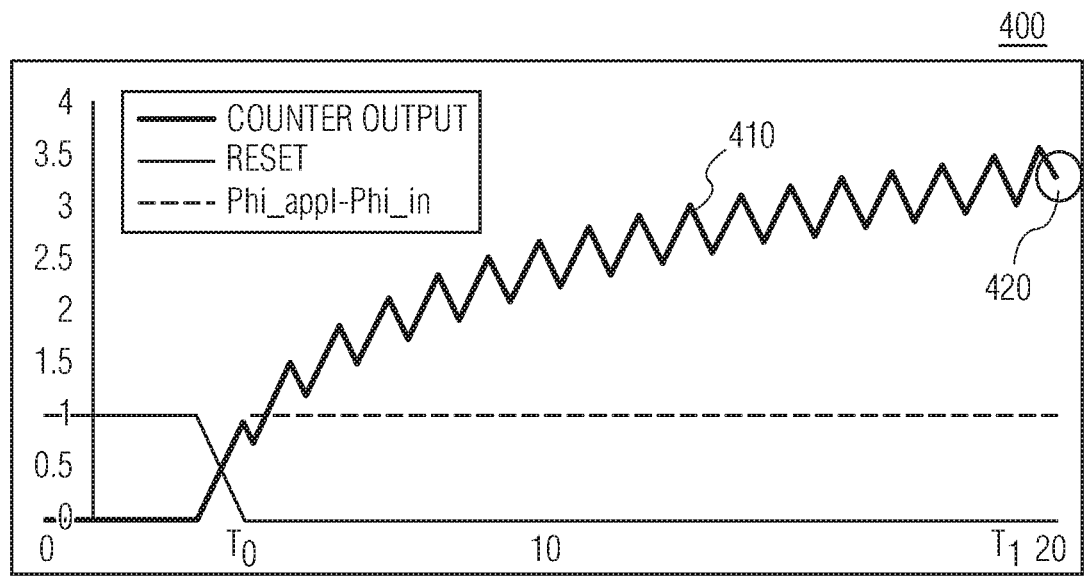
FIG. 4 is a simplified chart illustrating an example of output from a counter after applying a phase step at the PLL input.

FIG. 4 is a simplified chart illustrating an example of output from a counter 310 after applying a phase step at the PLL input. At time $T_0$, a phase step is applied, and the counter output increases as phase comparator 120 compensates for the shift in phase. The counter value at time $T_1$ (420) is proportional to the area A discussed above. The counter value at time $T_1$ can then be compared to upper and lower thresholds, taking into account a sufficient safety margin to avoid false alerts. These thresholds are set in light of performance requirements for the PLL (e.g., for the particular application how responsive the PLL is required to be). It should be noted that the number of counts can be, for example, tens or hundreds of counts, depending upon the values for $T_0$ and $T_1$ and the nature of the PLL.

It is desirable to conduct these tests while the PLL is in application mode (e.g., performing normal operational tasks and not a special test mode). For safety critical applications, especially involving automotive installations, faults in integrated circuits should be near zero and thus testing of the involved circuitry, including PLLs, should be performed while the circuitry is operational. Thus, the magnitude of phase disturbance D1 should be low enough for the PLL to maintain lock and therefore not disturb the application being executed, while also the magnitude should be sufficient to provide a sufficient signal-to-noise margin.

Embodiments provide a variety of advantages, including, for example, if a phase step is sufficiently small or the intervals of the phase steps are such that their spectrum does not disturb the application, then the PLL test can be performed concurrent to the application, as discussed above. This allows for detection of single event upsets (e.g., due to cosmic radiation) that cause unreliable data in an apparatus associated with the PLL. In addition, with the ability to perform testing during application mode, high coverage can be achieved, which again, is important for safety critical applications. Further, embodiments have high sensitivity for parametric deviations of the loop filter, VCO, and phase comparator.

Counter 310 can provide the count values to controller 320. Controller 320 can then react to the count value if the count value is outside the range set by the low and high thresholds. In some embodiments, depending upon the nature of the application, the threshold that is violated, and the PLL, controller 320 can respond by, for example, rebooting the PLL, flagging to a processor that the PLL is unreliable and therefore any information generated by circuitry coupled to the PLL is unreliable, put circuitry associated with the PLL into a failsafe mode, or reduce a data rate on an interface associated with the PLL to keep a bit error rate in an acceptable range. A processor or a state machine (not shown) can be coupled to controller 320 to provide more sophisticated responses to a PLL out of the determined operational range.

In other embodiments, the final counter value can be used for trimming one or more critical components of the PLL (e.g., components sensitive to process spread, voltage variations, temperature, ageing, and the like). By trimming in real time, such embodiments allow for simpler, smaller, or cheaper components for the VCO or loop filter. Trimming is performed as an iterative process. After monitoring the PLL and performing the trimming, area A (or area A1-A2) are evaluated and checked to determine whether the trim modifications caused the area to be closer to the desired value. If no change, or worsening, then the trim modifications can be discarded. If better, then trimming can be performed again to get the area more solidly within the threshold values.

FIGS. 2-4 illustrate determining performance of a PLL having a second order or higher loop filter. In such PLL, $\phi_{diff}(t)$ converges to zero when settling, and the area A can be measured as discussed above. On the other hand, a first order loop filter results in a non-zero value to which $\phi_{diff}(t)$ converges and therefore extra measures need to be taken for measurement of area A. These extra measures are discussed below.

Figure 5:
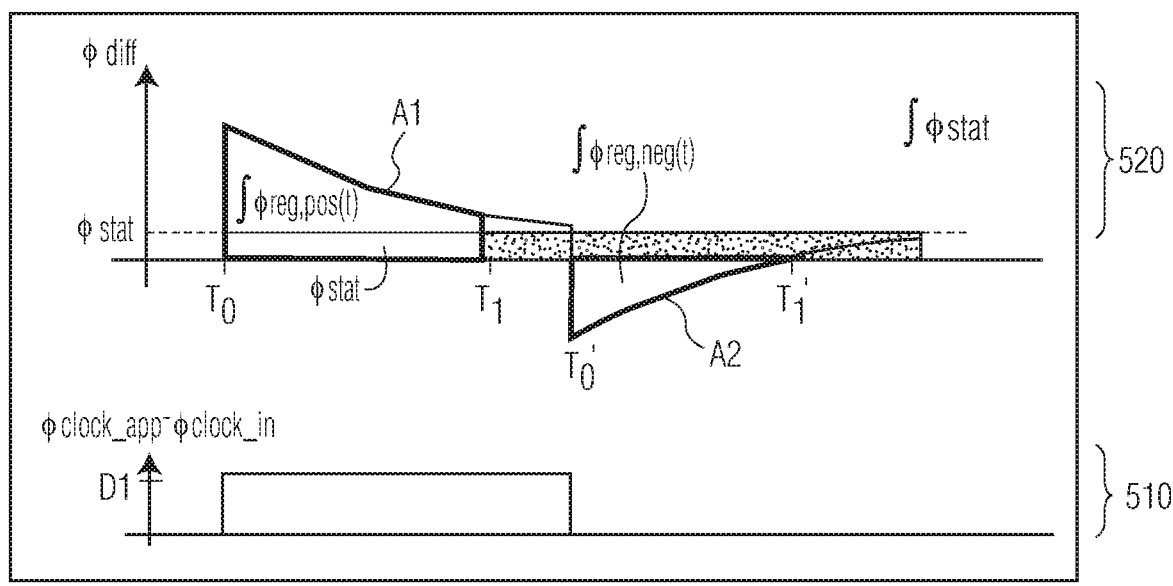
FIG. 5 is a chart illustrating a reaction of a PLL having a first order loop filter to introduction of a delay D1 charting phase difference, $\phi_{diff}$, at the phase comparator of over time.

FIG. 5 is a chart illustrating a reaction of a PLL having a first order loop filter to introduction of a delay D1, charting phase difference, $\phi_{diff}$, at the phase comparator over time. Bottom chart 510 illustrates an initial phase step by switching clock_in from no delay to delay D1 at time $T_0$. Top chart 520 illustrates that for a PLL having a first order loop filter, $\phi_{diff}(t)$ converges to a non-zero value, $\phi_{stat}$, after the phase difference D1 is applied. In light of this non-zero convergence value, the part of $\phi_{diff}(t)$ due to the step D1 and the part due to $\phi_{stat}$ cannot be directly measured. Between $T_0$ and $T_1$, the part of $\phi_{diff}(t)$ that is due to the step is named $\phi_{reg,pos}(t)$, but since $\phi_{stat}$ is unknown, area A1 can only be measured:

$$A1 = \int_{T_0}^{T_1} \phi_{diff,pos}(t)dt = \phi_{stat} + \int_{T_0}^{T_1} \phi_{reg,pos}(t)dt$$

To calculate the value of area A, once the PLL has settled from the positive phase step, a negative phase step is applied at $T_0'$ and an area A2 is measured from $T_0'$ to $$A2 = \int_{T_0'}^{T_1'} \phi_{diff,neg}(t)dt = \phi_{stat} + \int_{T_0'}^{T_1'} \phi_{reg,neg}(t)dt$$

Since the PLL is linear, the response to the negative phase step is the inverted response to a positive phase step. This results in $\emptyset_{reg,pos} = \emptyset_{reg,neg}$, and because $T_1 - T_0 = T_0'$:

$$A1 - A2 = 2\int_{T_0'}^{T_1'} \phi_{reg}(t)dt$$

This difference in the areas A1 and A2 is indicative of the health of the PLL (e.g., for regulation behavior, loop filter characteristic, gain of VCO, and the like).

Figure 6:
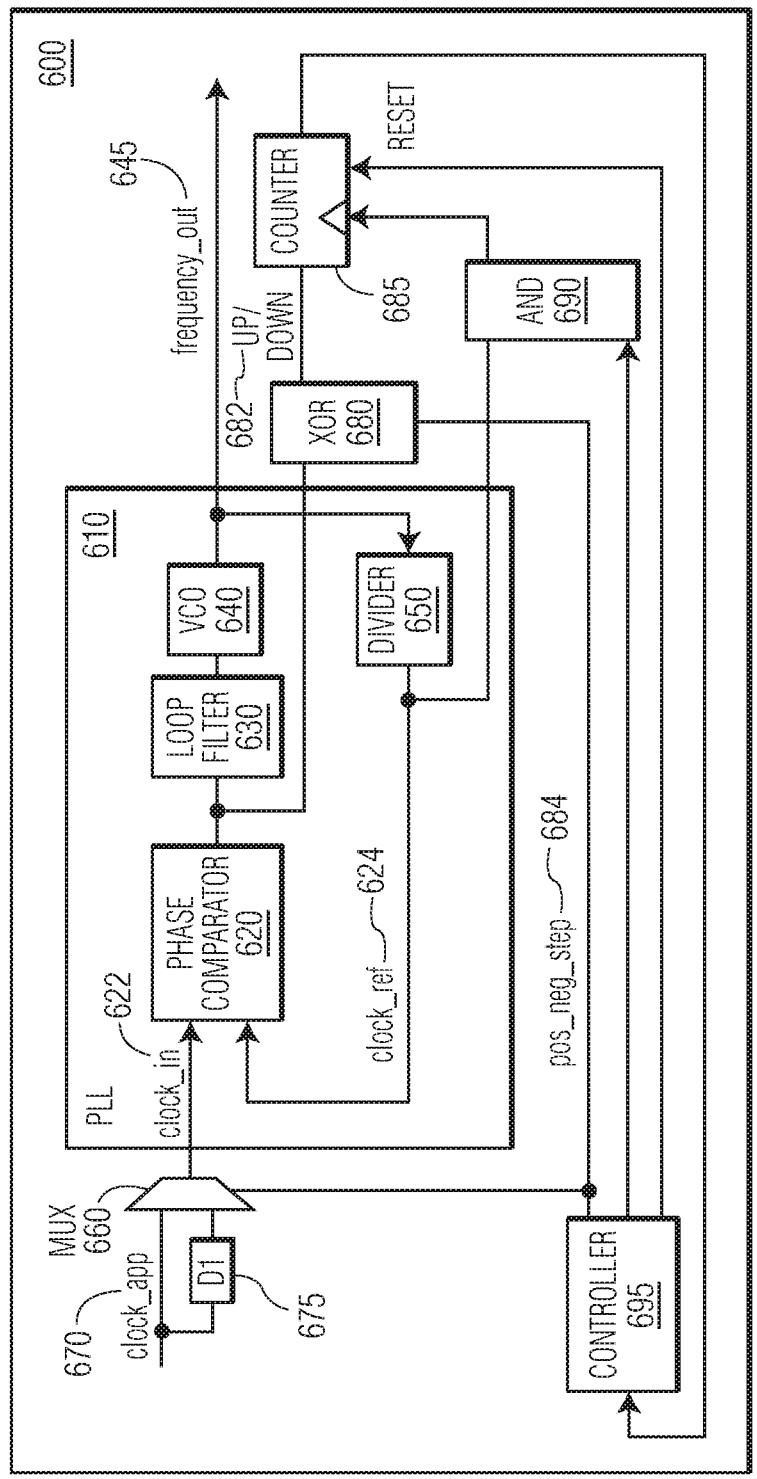
FIG. 6 is a simplified block diagram illustrating an example of a system having a circuit used in conjunction with a PLL having a first order loop filter to provide a measure of area A1-A2 described above.

FIG. 6 is a simplified block diagram illustrating an example of a system 600 having a circuit used in conjunction with a PLL having a first order loop filter to provide a measure of area A1-A2 described above. The circuit provided in FIG. 6 measures a proxy for the difference in the areas A1 and A2. The difference can then be compared to an upper and lower limit. The upper and lower limits are thresholds for error behavior exhibited by the PLL.

In FIG. 6, phase comparator 620 in PLL 610 delivers a binary output signal. As discussed above, loop filter 630 is a first order loop filter providing the filtered signal to VCO 640, which provides output frequency 645. The VCO provides a feedback signal to divider 650 that delivers negative feedback to phase comparator 620. Counter 685 counts clock_ref cycles 624 or VCO 640 cycles in a manner that is dependent upon pos_neg_step signal 684. The pos_neg_step signal is provided to XOR 680, which can reverse the signal from phase comparator 620. Thus, if pos_neg_step 684 is set to zero by controller 695, in order to measure A1, then if the phase comparator output is 1, the counter counts upwards, and if the phase comparator output is 0, then the counter counts downwards. Likewise, if pos_neg_step 684 is set to one by controller 695, in order to measure A2, then if the phase comparator output is 1, the counter counts downwards, and if the phase comparator output is 0, the counter counts upwards.

Figure 7:
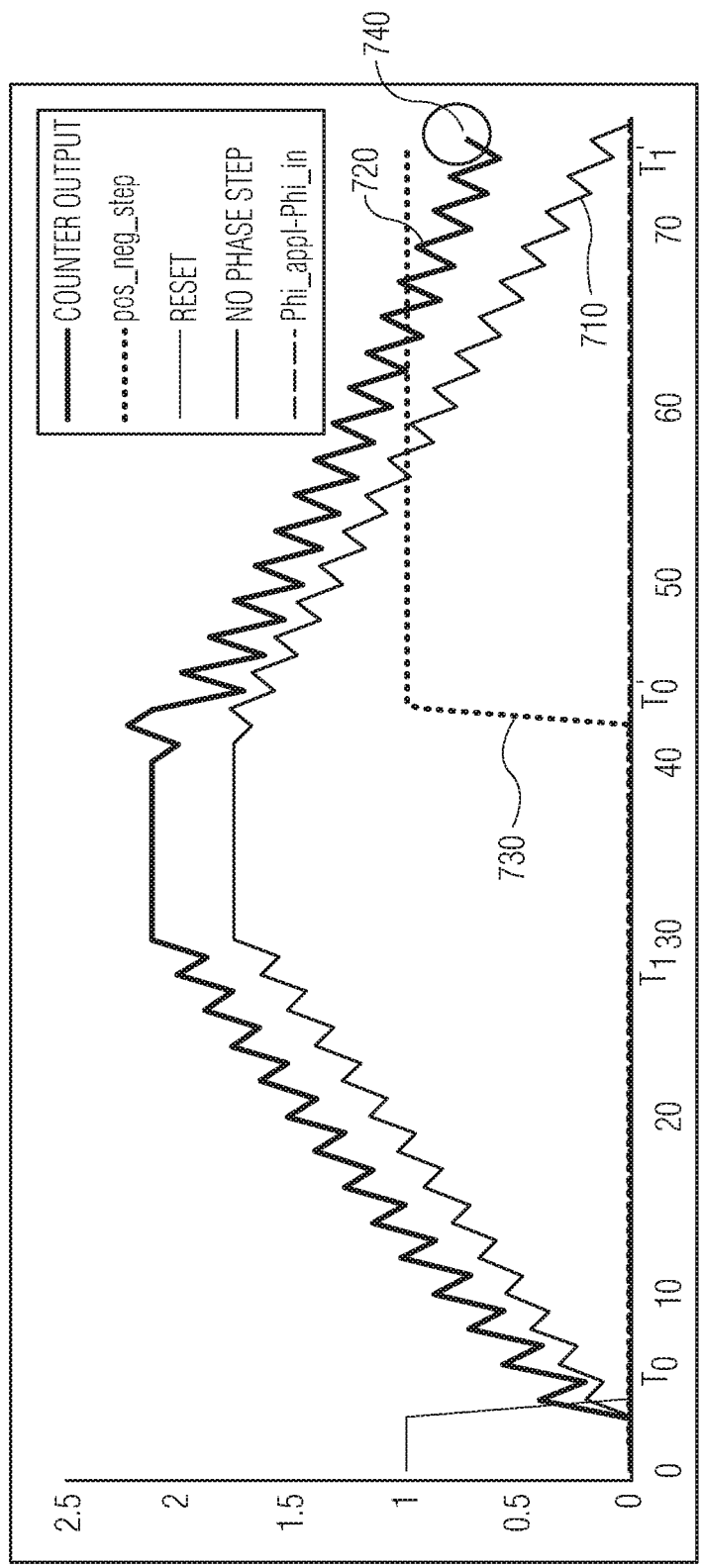
FIG. 7 is a chart illustrating the counter state, counter reset, and pos_neg_step for a PLL having no phase step as an input and having a phase step as an input.

FIG. 7 is a chart illustrating the counter state, counter reset, and pos_neg_step for a PLL having no phase step as an input (710) and having a phase step as an input (720). Arbitrary units are shown for the time axis and the y-axis. For the no-phase step counter output curve (710), at time $T_0$ a reset is applied to the counter (zeroing the counter), and pos_neg_step 730 is also zeroed. In response, the counter begins to count upward to time $T_1$. At time $T_0'$, pos_neg_step 730 is set to 1, and the counter counts downward to time $T_1'$. For a PLL having a first order filter in lock without a phase difference jump, the counter returns to zero at time $T_1'$.

For curve 720, a phase step is introduced. In the first portion of the curve (from $T_0$ to $T_1$), due to the positive input phase step, the reaction of the phase comparator leads to more "1" states than "0" states. Due to pos_neg_step=0, the counter counts more upward than when having no phase step. In the second portion of the curve (from $T_0'$ to $T_1'$), due to the negative input phase step and due to pos_neg_step=1, the counter counts less down than when having no phase step. As a result, the reaction to the phase step during both time periods is an increased counter value compared to having no input phase step D1. The final counter value 740 is proportional to the area difference A1-A2, which is representative of the performance of the PLL.

Linearity of a first order PLL can be determined using a similar methodology as discussed for FIG. 7. A counter value C1 (e.g., 740) can be obtained for a PLL when a positive phase step is provided. The counter value can be stored by, for example, controller 695. Subsequently, a counter value C2 can be measured for a PLL in which a negative phase step is provided. If the PLL is behaving linearly, reversing the sign of the stimulus will result in the same response with a reversed sign (e.g., C1=−C2). This can test linearity and regulation range of the phase comparator, loop filter, and VCO of the PLL.

For PLLs having a loop filter of second order or higher, frequencies of the poles of the loop transfer function can differ by a significant ratio (e.g., a factor of 30). In such a case, taking different measurements over differing time periods can be advantageous to determine whether there are different settling behaviors. In other words, some settling issues may only be visible if taken over a short period, rather than a longer period wherein a potential settling issue may average out over the long period.

In another embodiment, the length of the phase steps, and therefore counter period, can be varied in order to intentionally dither the PLL output clock. By introducing an additional phase step, the spectrum of the PLL output frequency is changed. By taking a shorter time period, measurement accuracy can be increased for failures in timing and timing elements with differing constants. In some applications, the PLL output frequency can be intentionally dithered to distribute the PLL output over a small spectrum range, instead of a single spectrum line. This may reduce the sensitivity to electromagnetic disturbance and reduces disturbing other electronic systems.

In another embodiment, in order to test large signal behavior, large phase steps (e.g., 180 degrees) can be applied. This would likely unlock the PLL and disturb the application for which the PLL is associated. Thus, such testing would be possible only outside the application mode, which is different from the above embodiments.

Figure 8:
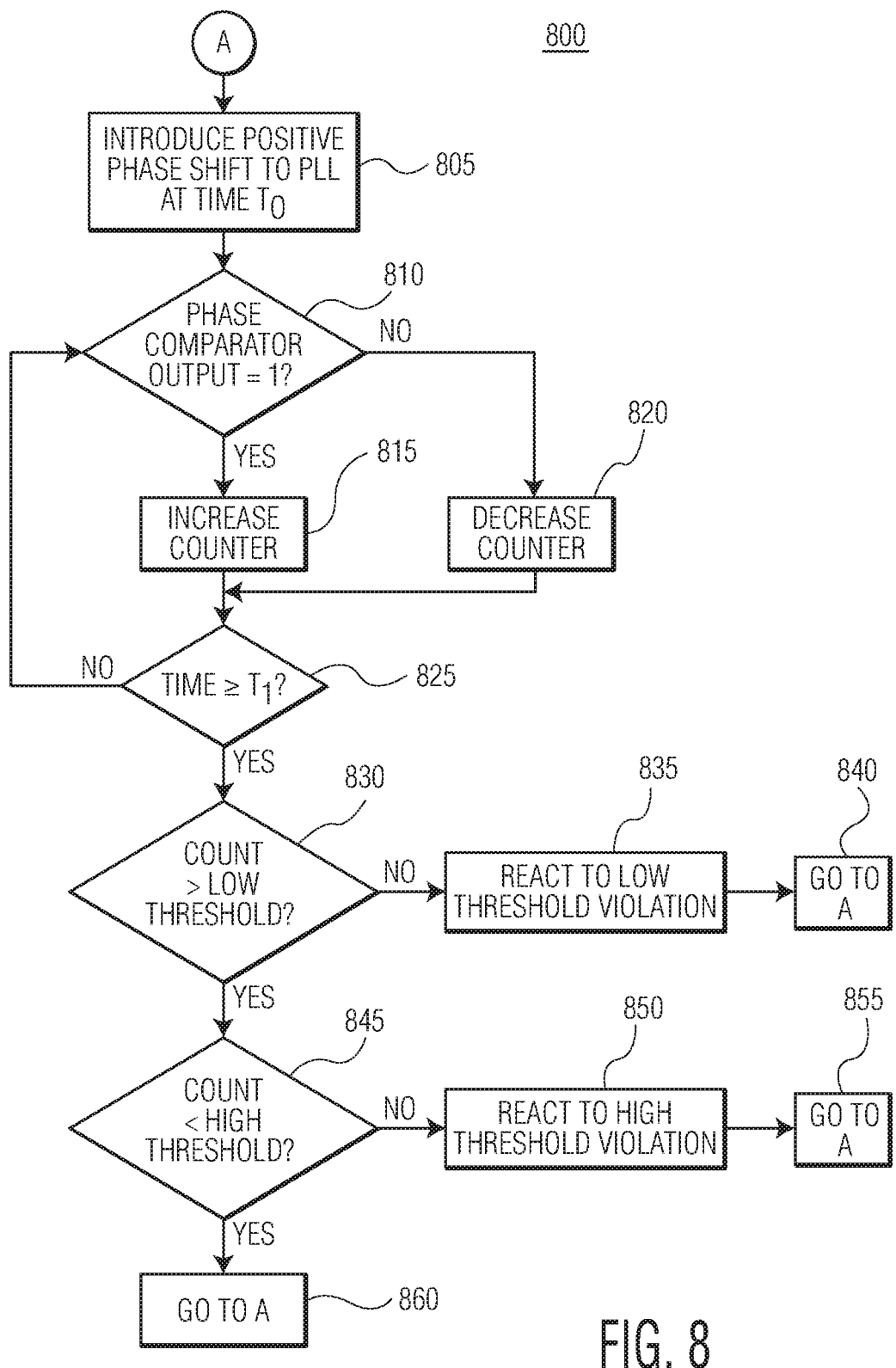
FIG. 8 is a simplified flow diagram illustrating an example process for monitoring and adjusting a PLL using the circuitry elements discussed above.

FIG. 8 is a simplified flow diagram illustrating an example process 800 for monitoring and adjusting a PLL using the circuitry elements discussed above. A positive phase step from an application clock is introduced to a PLL at a time $T_0$ (805). The magnitude of the positive phase step is set such that the PLL can maintain lock and performance of the PLL is tolerably affected in a manner such that the test can be conducted during normal operational mode. A determination is made as to whether the phase comparator output is "1", thereby indicating that the phase comparator is attempting to increase the oscillator frequency in order to adjust the phase of the frequency back to the reference frequency (810). If the phase comparator output is equal to "1", then the counter increases in value (e.g., by one step) (815). If the phase comparator output is equal to "0", then the counter decreases in value (e.g., by one step) (820). Counting continues until the time period is $T_1$ (825).

Once the time reaches $T_1$, a determination is made as to whether the count is greater than the low threshold (e.g., by a controller 320). If the count is less than the low threshold, then the area under the $\phi_{diff}(t)$ curve is below the expected value and the system reacts to the low threshold violation (835). This reaction can be performed by a controller (e.g., 320) or by a processor or state machine coupled to the controller or the counter, which is configured to perform corrective actions. As discussed above, the corrective actions can include, for example, re-trimming the PLL, rebooting the PLL, flagging that the PLL is unreliable, putting circuitry associated with the PLL into failsafe mode, and reducing data rate on an interface associated with the PLL. Once the system reacts to the low threshold violation, the system can return to monitoring the behavior of the PLL (840).

If the count is greater than the low threshold, then a check is made to determine whether the count is less than a high threshold (845). If the count is greater than the high threshold, then the area under the $\phi_{diff}(t)$ curve is above the expected value and the system reacts to the high threshold violation (850). Similar reactions can be performed as with the low threshold violation. Once the system reacts to the high threshold violation, the system can return to monitoring the behavior of the PLL (855). If the area under the $\phi_{diff}(t)$ curve is within the expected thresholds, then the system returns to monitoring the behavior of the PLL (860). Similar processes are used for embodiments incorporating a negative phase step, either initially or subsequent to a positive phase step, as discussed above.

Embodiments of the present invention provide an efficient mechanism to test the health of PLL during periods of operation of the PLL. This allows for constant monitoring of PLLs in a mission-critical or safety-sensitive circuit and the circuits with which this circuit is associated. Embodiments can be used with a wide variety of PLLs having first order or higher loop filters, without modification of the PLL itself.

By now it should be appreciated that there has been provided a method for testing a phase-locked loop circuit (PLL). The method includes introducing a first phase step to a clock input of the PLL where the first phase step induces a phase difference at a phase comparator of the PLL, determining a first area defined by a curve associated with a magnitude of the phase difference between an initial time $T_0$ and a second time $T_1$, and determining that the PLL has a defect when the first area is lower than a bottom threshold and greater than an upper threshold.

In one aspect of the above embodiment, the method further includes performing said introducing the first phase step during a normal operation of the PLL. In a further aspect, the method includes setting a magnitude of the first phase step below a phase difference that puts the PLL out of lock. In another aspect, the method further includes setting $T_0$ to coincide with said introducing the first phase step. In another aspect, the method further includes setting $T_1$ to a time prior to the curve associated with the phase difference crossing A0-phase difference. In yet a further aspect, the method further includes setting $T_1$ to a time sufficient to average out initial jitter effects induced by the first phase step.

In still another aspect of the above embodiment, the area includes, for each clock cycle from $T_0$ to $T_1$, incrementing a counter when an output of a phase comparator of the PLL is a logic "1", where the phase comparator is configured to generate a binary output, and decrementing the counter when the output of the phase comparator the PLL is logic "0" where a value of the counter at $T_1$ corresponds to the first area defined by the curve associated with the magnitude of the phase difference. In a further aspect, the method further includes predetermining a lower count value corresponding to the bottom threshold for the first area and predetermining an upper account value corresponding to the upper threshold for the first area.

In another aspect of the above embodiment the method further includes reacting to determining that the PLL has a defect where the reacting includes one or more of: adjusting trim or calibration values of one or more PLL component, rebooting the PLL or a circuit clocked by the PLL, flagging the PLL as unreliable, putting the PLL in a failsafe mode, putting a circuit including the PLL in a failsafe mode, and reducing a data rate of an interface associated with the PLL. In another aspect of the above embodiment, the PLL includes a loop filter of a second or higher order. In yet another aspect of the above embodiment, the method further includes introducing a second phase step to the clock input of the PLL where the second phase step induces a phase difference opposite and equal in magnitude to the phase step, determining a second area defined by a portion of the curve associated with the magnitude of the phase difference between a second initial time $T_0'$ and a second time $T_1'$, where $T_0'$ coincides with the introducing of the second phase step, and determining that the PLL has a defect when a difference between the first area and the second area is lower than a second bottom threshold or greater than a second upper threshold where the PLL includes a first order loop filter.

In another embodiment, an apparatus is provided that includes a PLL including a phase comparator having a binary output, a counter coupled to an output of the phase comparator and configured to increment the counter value when the comparator output is logic "1" and decrement the count value in the comparator output is logic "0", and a controller coupled to the counter and an input of the PLL. The controller is configured to introduce a first phase step to a clock input of the PLL where the first phase step induces a phase difference at the phase comparator, determine a first area defined by a curve associated with a magnitude of the phase difference at the phase comparator between an initial time $T_0$ and a second time $T_1$ where a value of the counter at $T_1$ corresponds to the first area defined by the curve, and determine that the PLL has a defect if the first area is lower than a bottom threshold or greater than an upper threshold.

In one aspect of the above embodiment, the first phase step is introduced during a normal operation of the PLL. In a further aspect, the magnitude of the first phase step is below a phase difference that puts the PLL out of lock. In another aspect, the initial time $T_0$ coincides with said introducing the first phase step. In yet another aspect, the time $T_1$ is less than a time for the curve associated with the phase difference across a zero-phase difference. In a further aspect, the time $T_1$ is sufficient to average out initial jitter effects induced by the first phase step.

In another aspect, the controller is further configured to react to determining that the PLL has a defect, and reacting includes one or more of adjusting trim or calibration values of one or more PLL component, rebooting the PLL or a circuit clocked by the PLL, flagging the PLL as unreliable, putting the PLL in a failsafe mode, putting a circuit comprising the PLL in a failsafe mode, and reducing a data rate of an interface associated with the PLL.

In another aspect, the PLL includes a first order loop filter, and the controller is further configured to: introduce a second phase step to the clock input to the PLL where the second phase step induces a phase difference opposite and equal in magnitude to the first phase step; determine a second area defined by a portion of the curve associated with the magnitude of the phase difference between an initial time $T_0'$ and a second time $T_1'$ where $T_0'$ coincides with introducing the second phase step; and determine that the PLL has a defect when a difference between the first area and the second area is lower than a second bottom threshold or greater than a second upper threshold.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different circuit arrangements. For example, although FIGS. 1 and 3 and the discussion thereof describe exemplary architectures, the exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the desired functionality.

Also, for example, in one embodiment, the illustrated elements of system 300 are circuitry located on a single integrated circuit or within a same device. Alternatively, system 300 may include any number of separate integrated circuits or separate devices interconnected with each other.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, PLLs having loop filters of different orders and operational ranges can be used in conjunction with embodiments of the present invention. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for testing a phase-locked loop circuit, the method comprising:
   introducing a first phase step to a clock input of the phase-locked loop circuit (PLL), wherein the first phase step induces a phase difference at a phase comparator of the PLL;
   determining a first area defined by a curve associated with a magnitude of the phase difference between an initial time $T_0$ and a second time $T_1$; and
   determining that the PLL has a defect when the first area is lower than a lower threshold and greater than an upper threshold.

2. The method of claim 1 further comprising performing said introducing the first phase step during a normal operation of the PLL.

3. The method of claim 2 further comprising setting a magnitude of the first phase step below a phase difference that puts the PLL out of lock.

4. The method of claim 1 further comprising setting $T_0$ to coincide with said introducing the first phase step.

5. The method of claim 1 further comprising setting $T_1$ to a time prior to the curve associated with the phase difference crossing a zero-phase difference.

6. The method of claim 5 further comprising setting $T_1$ to a time sufficient to average out initial jitter effects induced by the first phase step.

7. The method of claim 1 wherein said area comprises, for each clock cycle from $T_0$ to $T_1$:
   incrementing a counter when an output of a phase comparator of the PLL is logic "1", wherein the phase comparator is configured to generate a binary output; and
   decrementing the counter when the output of the phase comparator of the PLL is logic "0", wherein a value of the counter at $T_1$ corresponds to the first area defined by the curve associated with the magnitude of the phase difference.

8. The method of claim 7 further comprising:
   predetermining a lower count value corresponding to the lower threshold for the first area; and
   predetermining an upper count value corresponding to the upper threshold for the first area.

9. The method of claim 1 further comprising:
   reacting to said determining that the PLL has a defect, wherein said reacting comprises one or more of
   adjusting trim or calibration values of one or more PLL components,
   rebooting the PLL or a circuit clocked by the PLL,
   flagging the PLL as unreliable,
   putting the PLL in a failsafe mode,
   putting a circuit comprising the PLL in a failsafe mode, and
   reducing a data rate of an interface associated with the PLL.

10. The method of claim 1 wherein the PLL comprises a loop filter of a second or higher order.

11. The method of claim 1 further comprising:
   introducing a second phase step to the clock input of the PLL, wherein the second phase step induces a phase difference opposite and equal in magnitude to the first phase step;
   determining a second area defined by a portion of the curve associated with the magnitude of the phase difference between a second initial time $T_0'$ and a second time $T_1'$, wherein $T_0'$ coincides with said introducing the second phase step; and
   determining that the PLL has a defect when a difference between the first area and the second area is lower than a second lower threshold or greater than a second upper threshold, wherein the PLL comprises a first order loop filter.

12. An apparatus comprising:
   a phase-locked loop (PLL) comprising a phase comparator having a binary output;
   a counter, coupled to an output of the phase comparator, and configured to increment a count value when the comparator output is logic "1" and decrement the count value when the comparator output is logic "0";
   a controller, coupled to the counter and an input of the PLL, and configured to introduce a first phase step to a clock input of the PLL, wherein the first phase step induces a phase difference at the phase comparator,
   determine a first area defined by a curve associated with a magnitude of the phase difference at the phase comparator between an initial time $T_0$ and a second time $T_1$ wherein a value of the counter at $T_1$ corresponds to the first area defined by the curve, and
   determine that the PLL has a fault if the first area is lower than a lower threshold or greater than an upper threshold.

13. The apparatus of claim 12 wherein the first phase step is introduced during a normal operation of the PLL.

14. The apparatus of claim 13 wherein the magnitude of the first phase step is below a phase difference that puts the PLL out of lock.

15. The apparatus of claim 12 wherein the initial time $T_0$ coincides with said introducing the first phase step.

16. The apparatus of claim 12 wherein the time $T_1$ is less than a time for the curve associated with the phase difference to cross a zero-phase difference.

17. The apparatus of claim 16 wherein time $T_1$ is sufficient to average out initial jitter effects induced by the first phase step.

18. The apparatus of claim 12, wherein
   the controller is further configured to react to determining that the PLL has a fault, and
   said reacting comprises one or more of
   adjusting trim or calibration values of one or more PLL components,
   rebooting the PLL or a circuit clocked by the PLL,
   flagging the PLL as unreliable,
   putting the PLL in a failsafe mode,
   putting a circuit comprising the PLL in a failsafe mode, and
   reducing a data rate of an interface associated with the PLL.

19. The apparatus of claim 12, wherein the PLL comprises a first order loop filter, and the controller is further configured to
   introduce a second phase step to the clock input of the PLL, wherein the second phase step induces a phase difference opposite and equal in magnitude to the first phase step;
   determine a second area defined by a portion of the curve associated with the magnitude of the phase difference between an initial time $T_0'$ and a second time $T_1'$, wherein $T_0'$ coincides with said introducing the second phase step;

determine that the PLL has a fault when a difference between the first area and the second area is lower than a second lower threshold or greater than a second upper threshold.

20. The apparatus of claim 12 wherein the PLL comprises a loop filter of a second or higher order.

* * * * *